United States Patent
Wee et al.

(10) Patent No.: US 10,410,965 B2
(45) Date of Patent: Sep. 10, 2019

(54) LAYOUT TECHNIQUE FOR MIDDLE-END-OF-LINE

(71) Applicant: QUALCOMM Incorporated, San Diego, CA (US)

(72) Inventors: Tin Tin Wee, San Diego, CA (US); Trilochan Sahoo, Bangalore (IN); Sunil Sukumarapillai, Bangalore (IN); Arun Kumar Kodigenahalli Venkateswar, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/159,042

(22) Filed: Oct. 12, 2018

(65) Prior Publication Data

US 2019/0067189 A1 Feb. 28, 2019

Related U.S. Application Data

(62) Division of application No. 15/628,909, filed on Jun. 21, 2017, now Pat. No. 10,325,845.

(51) Int. Cl.
*H01L 23/522* (2006.01)
*H01L 29/78* (2006.01)
(Continued)

(52) U.S. Cl.
CPC .. *H01L 23/5226* (2013.01); *H01L 21/823431* (2013.01); *H01L 21/823475* (2013.01); *H01L 27/0886* (2013.01); *H01L 29/41725* (2013.01); *H01L 29/41791* (2013.01); *H01L 29/785* (2013.01)

(58) Field of Classification Search
CPC .......................... H01L 23/5226; H01L 27/0886
See application file for complete search history.

(56) References Cited

U.S. PATENT DOCUMENTS

2012/0273899 A1 11/2012 Wann et al.
2016/0181257 A1* 6/2016 Liaw ................... H01L 27/0207
257/401

(Continued)

FOREIGN PATENT DOCUMENTS

CN 106611782 A 5/2017
EP 3073528 A1 9/2016

OTHER PUBLICATIONS

International Search Report and Written Opinion—PCT/US2018/035033—ISA/EPO—Sep. 14, 2018.

*Primary Examiner* — Walter H Swanson
(74) *Attorney, Agent, or Firm* — Loza & Loza, LLP/Qualcomm

(57) ABSTRACT

A die includes one or more fins, a gate formed over a first portion of the one or more fins, and a first source/drain contact formed over a second portion of the one or more fins, wherein the first source/drain contact includes an extended portion that does not overlap the one or more fins. The die also includes first and second metal lines formed from a first metal layer, wherein the first and second metal lines are spaced apart. The die further includes a first via connecting the first source/drain contact to the first metal line, and a second via connecting the first source/drain contact to the second metal line, wherein the second via lies within the extended portion of the first source/drain contact.

7 Claims, 13 Drawing Sheets

(51) Int. Cl.
*H01L 27/088* (2006.01)
*H01L 29/417* (2006.01)
*H01L 21/8234* (2006.01)

(56) References Cited

U.S. PATENT DOCUMENTS

| | | |
|---|---|---|
| 2016/0190065 A1* | 6/2016 | Liaw .................. H01L 23/5283 |
| | | 257/751 |
| 2016/0260669 A1 | 9/2016 | Paak et al. |
| 2016/0329241 A1 | 11/2016 | Lin et al. |
| 2016/0329276 A1 | 11/2016 | Lin et al. |
| 2016/0343708 A1 | 11/2016 | Park et al. |
| 2017/0110405 A1 | 4/2017 | Peng et al. |
| 2017/0200717 A1* | 7/2017 | Huang ................ H01L 27/0886 |
| 2017/0221905 A1* | 8/2017 | Chen ............... H01L 21/823821 |
| 2017/0256484 A1* | 9/2017 | Shen .................... H01L 21/762 |
| 2017/0317065 A1 | 11/2017 | Hirose |
| 2018/0374792 A1 | 12/2018 | Wee et al. |

* cited by examiner

LAYOUT TECHNIQUE FOR MIDDLE-END-OF-LINE

RELATED APPLICATION

The present application is a divisional of U.S. application Ser. No. 15/628,909, filed on Jun. 21, 2017, the entire specification of which is incorporated herein by reference.

BACKGROUND

Field

Aspects of the present disclosure relate generally to chip layout, and more particularly, to chip layout techniques for reducing middle-end-on-line (MEOL) parasitic resistance.

Background

The geometries of structures on semiconductor dies continue to scale down with advances in chip fabrication. Metal routing in the middle-end-of-line (MEOL) has become increasing more complex as geometries have scaled down and additional metal routing structures have been added in advanced deep sub-micron fabrication processes.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a die. The die includes one or more fins, a gate formed over a first portion of the one or more fins, and a first source/drain contact formed over a second portion of the one or more fins, wherein the first source/drain contact includes an extended portion that does not overlap the one or more fins. The die also includes first and second metal lines formed from a first metal layer, wherein the first and second metal lines are spaced apart. The die further includes a first via connecting the first source/drain contact to the first metal line, and a second via connecting the first source/drain contact to the second metal line, wherein the second via lies within the extended portion of the first source/drain contact.

A second aspect relates to a die. The die includes one or more fins, a first gate formed over a first portion of the one or more fins, and a first source/drain contact formed over a second portion of the one or more fins, wherein the first source/drain contact includes an extended portion that does not overlap the one or more fins. The die also includes a second source/drain contact formed over a third portion of the one or more fins, a second gate formed over a fourth portion of the one or more fins, wherein the second source/drain contact is between the first gate and the second gate, and a third source/drain contact formed over a fifth portion of the one or more fins, wherein the third source/drain contact includes an extended portion that does not overlap the one or more fins. The die also includes first and second metal lines formed from a first metal layer, wherein the first and second metal lines are spaced apart, a first via connecting the first source/drain contact to the first metal line, a second via connecting the first source/drain contact to the second metal line, wherein the second via lies within the extended portion of the first source/drain contact, a third via connecting the third source/drain contact to the first metal line, and a fourth via connecting the third source/drain contact to the second metal line, wherein the fourth via lies within the extended portion of the third source/drain contact.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
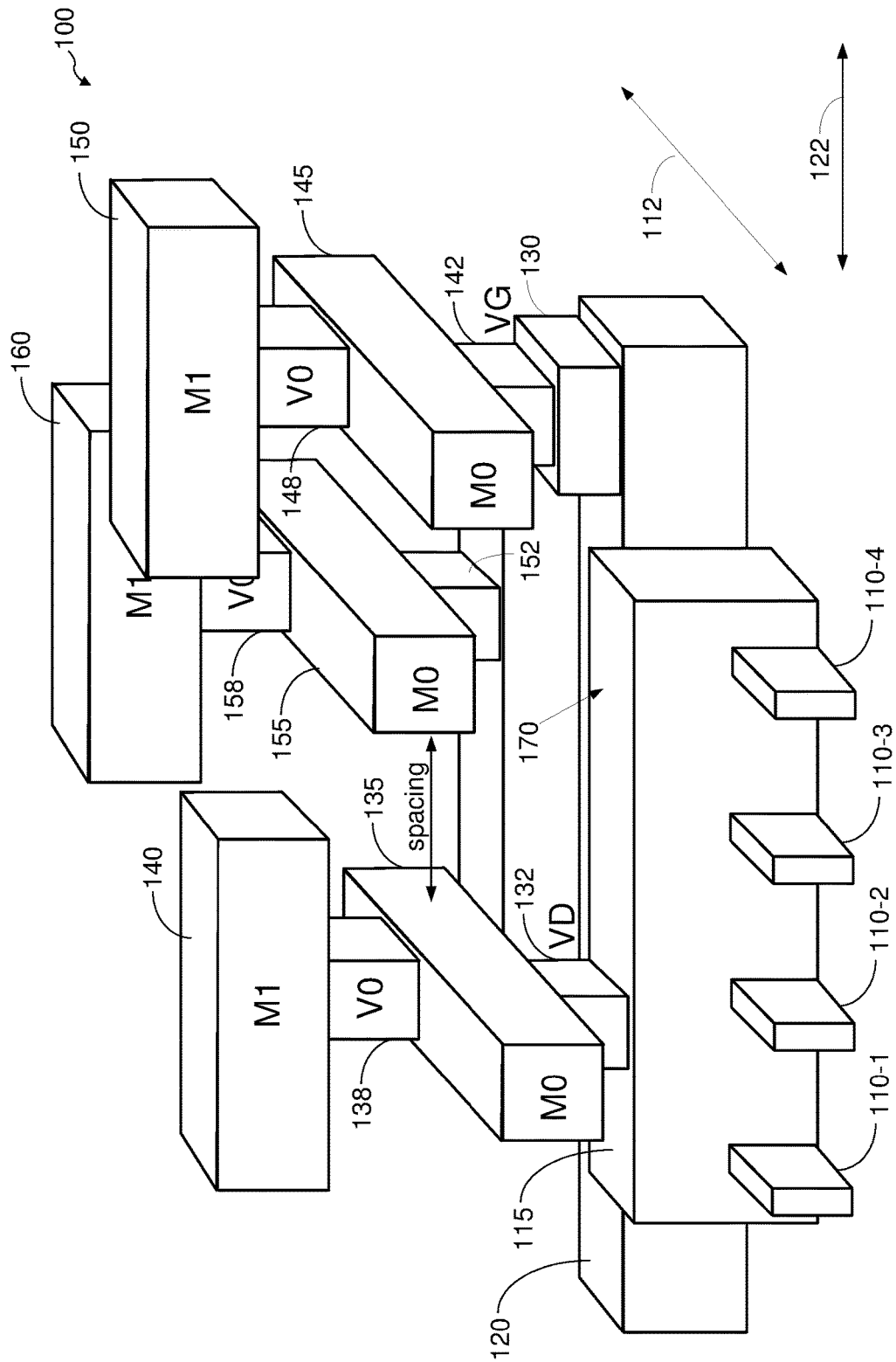
FIG. 1A shows a perspective view of a structure including a FinFET and interface structures for the FinFET according to certain aspects of the present disclosure.
Figure 1B:
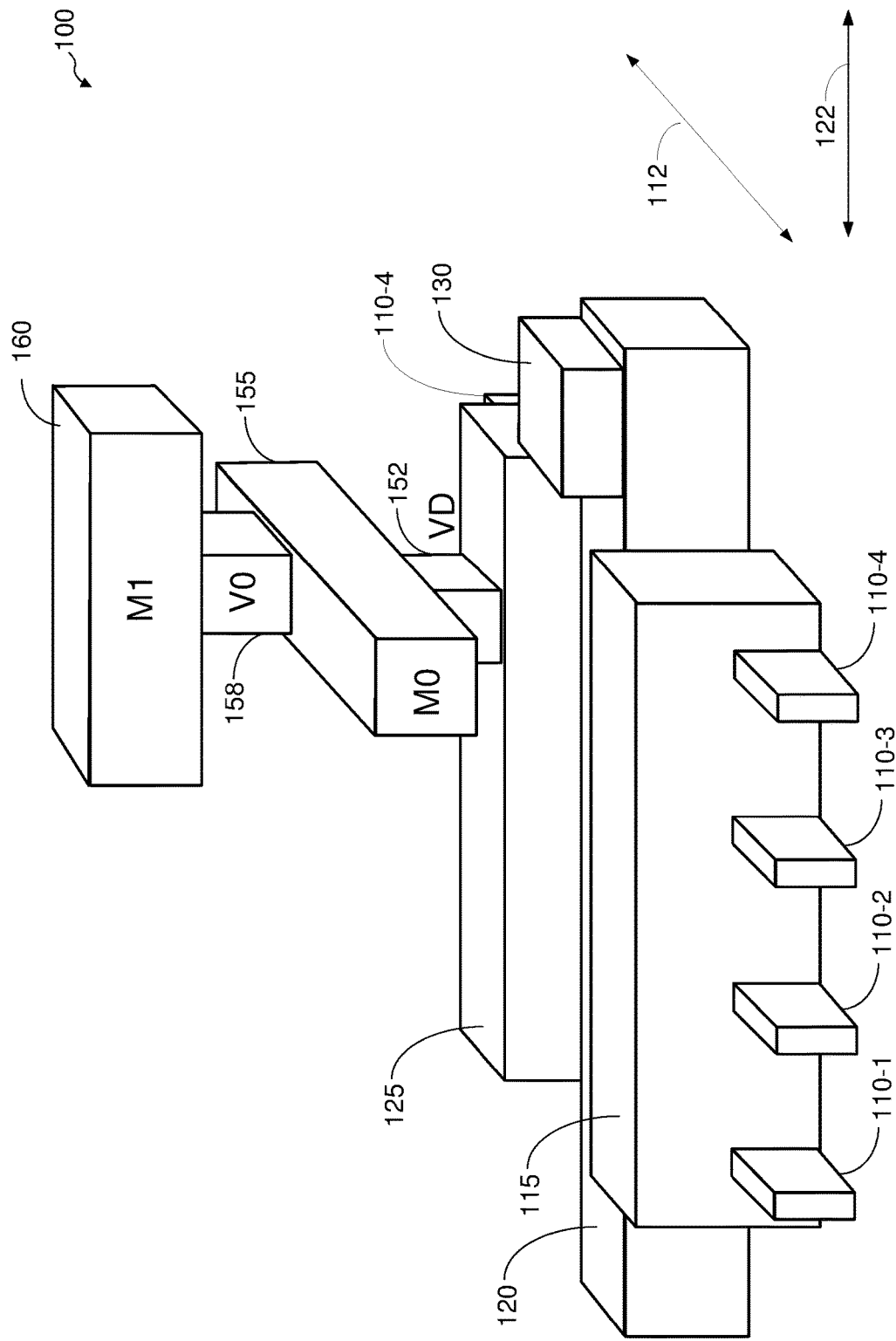
FIG. 1B shows a perspective view of the structure in FIG. 1A in which some of the interface structures shown in FIG. 1A are not shown in FIG. 1B in order to provide an unobstructed view of certain features of the structure.
Figure 1C:
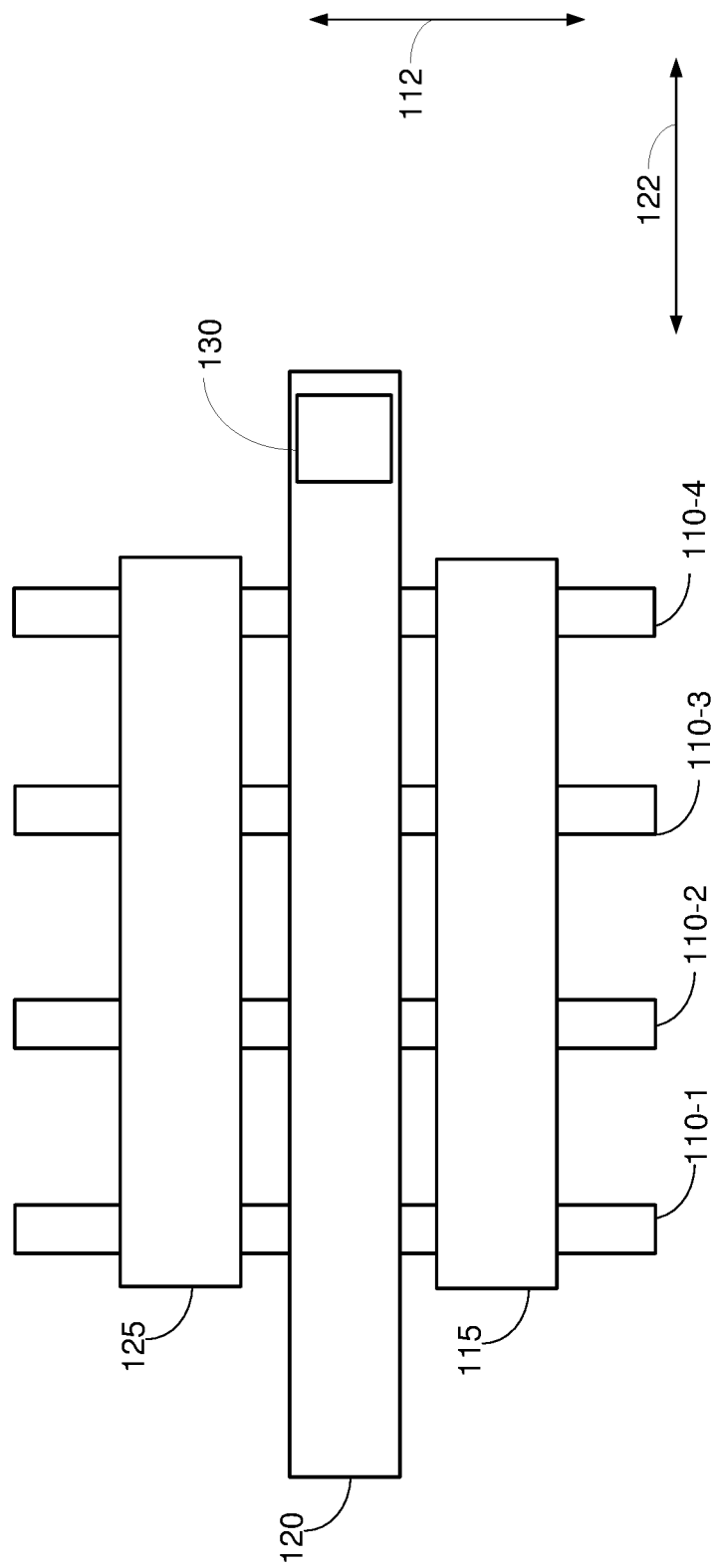
FIG. 1C shows a top view of the FinFET shown in FIGS. 1A and 1B according to certain aspects of the present disclosure.

FIGS. 1A-1C show an exemplary structure 100 formed above the substrate of a semiconductor die according to certain aspects of the present disclosure. The structure 100 includes a transistor and interface structures for interconnecting the transistor with another transistor (e.g., within the same cell) and/or connecting the transistor to upper metal layers in the back-end-of-line (BEOL) of the die. Although only one transistor is shown in FIGS. 1A-1C, it is to be appreciated that a die typically includes millions to billions of transistors.

In this example, the transistor is a Fin Field Effect Transistor (FinFET) having a three-dimensional structure. The FinFET includes one or more fins 110-1 to 110-4 that run parallel to each other, and extend in the lateral direction indicated by doubled-arrow line 112 in FIGS. 1A-1C. As used herein, the term "lateral" refers to a direction that is horizontal with respect to the substrate of the die. The fins 110-1 to 110-4 may be made of silicon, silicon germanium, silicon carbon, etc. Although four fins 110-1 to 110-4 are shown in the example in FIGS. 1A-1C, it is to be understood that the FinFET may include a different number of fins (e.g., one fin, two fins, three fins, etc.). Further, although the fins 110-1 to 110-4 are depicted in FIGS. 1A-1C as having rectangular cross sections (profiles), it is to be understood that the fins may having other cross-sectional shapes. For example, each fin may have a tapered cross section, in which the fin is thicker at the base than the top.

The FinFET also includes a gate 120 that runs perpendicular to the fins 110-1 to 110-4, and extends in the lateral direction indicated by doubled-arrow line 122 in FIGS. 1A-1C, which is perpendicular to lateral direction 112. The gate 120 is formed over a middle portion of the fins 110-1 to 110-4 such that first and second side portions of the fins 110-1 to 110-4 extend from opposite sides of the gate 120. This is shown in FIG. 1C, which shows a top view of the FinFET. The middle portion of the fins form the channel of the FinFET, in which a voltage applied to the gate 120 controls the conductance of the channel. The gate 120 may wrap around three or more sides of each fin (e.g., the top side and two opposite sidewalls of each fin). This increases the surface area between the gate 120 and the fins 110-1 to 110-4, providing improved electrical control over the channel conductance of the FinFET. The side portions of the fins 110-1 to 110-4 extending from the opposite sides of the gate 120 form the source and drain of the FinFET, as discussed further below.

The FinFET may also include a thin dielectric layer (not shown) interposed between the fins 110-1 to 110-4 and the gate 120. The dielectric layer may include a hafnium-based oxide dielectric, or another dielectric material.

The structure 100 also includes a first source/drain contact 115 and a second source/drain contact 125 on opposite sides of the gate 120 (refer to FIG. 1C). As used herein, the term "source/drain" means that a contact provides electrical contact with either the source or the drain of the FinFET. For example, the first source/drain contact 115 may provide contact with the drain of the FinFET, and the second source/drain contact 125 may provide contact with the source of the FinFET, or vice versa.

The first source/drain contact 115 is formed over the first side portion of the fins 110-1 to 110-4, and acts as a source or drain contact of the FinFET. The first source/drain contact 115 may contact one or more sides of each fin (e.g., the top side and two opposite sidewalls of each fin). The first source/drain contact 115 is made of one or more conductive materials (e.g., copper and/or another metal). The structure 100 may also include a sidewall spacer (not shown) between the gate 120 and the first source/drain contact 115. The sidewall spacer may be used to facilitate self alignment of the contact 115 and/or gate 120 during fabrication and prevent a short between the gate 120 and the contact 115.

The second source/drain contact 125 is formed over the second side portion of the fins 110-1 to 110-4, and acts as a source or drain contact of the FinFET. As shown in FIGS. 1A-1C, the second source/drain contact 125 is located on the opposite side of the gate 120 as the first source/drain contact 115. The second source/drain contact 125 may contact one or more sides of each fin (e.g., the top side and two opposite sidewalls of each fin). The second source/drain contact 125 is made of one or more conductive materials (e.g., copper or another metal). The structure 100 may include a sidewall spacer (not shown) between the gate 120 and the second source/drain contact 125. The sidewall spacer may be used to facilitate self alignment of the contact 125 and/or gate 120 during fabrication and prevent a short between the gate 120 and the contact 125.

The structure 100 also includes a gate contact 130 formed on top of the gate 120. The gate contact 130 is made of one or more conductive materials (e.g., copper and/or another metal).

FIG. 1C shows a top view of the FinFET, the first source/drain contact 115, the second source/drain contact 125, and the gate contact 130. As shown in FIG. 1C, the fins 110-1 to 110-4 extend laterally from opposite sides of the gate 120. The gate 130 is formed over the middle portion of the fins, the first source/drain contact 115 is formed over the first side portion of the fins, and the second source/drain contact 125 is formed over the second side portion of the fins.

Referring to FIG. 1A, the structure 100 includes an interface structure for the first source/drain contact 115. The interface structure includes a first metal-0 (M0) line 135 above the first source/drain contact 115, and a first metal-1 (M1) line 140 above the first M0 line 135. The first M0 line 135 is formed from a metal-0 (M0) layer of the die, and the first M1 line 140 is formed from a metal-1 (M1) layer of the die that is above the M0 layer. The M0 layer and the M1 layer may be used to form metal lines for interconnecting transistors (e.g., within the same cell) and connecting transistors to upper metal layers of the die (i.e., metal layers above metal layer M1). Metal lines may be formed from the M0 and M1 layers using lithography and etching and/or other fabrication techniques known in the art.

The interface structure also includes via 132 between the first source/drain contact 115 and the first M0 line 135, and via 138 between the first M0 line 135 and the first M1 line 140. In this example, via 132 is a vertical interconnect structure connecting the first source/drain contact 115 to the first M0 line 135, and via 138 is a vertical interconnect structure connecting the first M0 line 135 to the first M1 line 140. As used herein, the term "vertical" refers to a direction that is perpendicular to the substrate of the die. In FIGS. 1A-1C, a via between a source/drain contact and an M0 line is labeled "VD", and a via between an M0 line and an M1 line is labeled "V0." In the discussion below, a via between a source/drain contact and an M0 line is referred to as a "VD via", and a via between an M0 line and an M1 line is referred to as a "V0 via."

As shown in FIG. 1A, the first M0 line 135 and the first M1 line 140 are perpendicular to each other. As discussed above, the first M0 line 135 is formed from the M0 layer of the die. The M0 layer is found in advanced deep sub-micron processes (nodes). In these processes, the M0 layer is typically used to form unidirectional metal lines running in one lateral direction, and the M1 layer is used to form unidirectional metal lines running in a lateral direction that is perpendicular to the later direction of the M0 metal lines. The use of unidirectional metal lines allows advanced processes to achieve higher resolution at the expense of requiring an additional metal layer (i.e., M0 layer) for bi-directional metal routing.

The structure 100 includes an interface structure for the gate contact 130. The interface structure for the gate contact 130 includes a second M0 line 145 above the gate contact 130, and a second M1 line 150 above the second M0 line 145. The second M0 line 145 is formed from the M0 layer of the die, and the second M1 line 150 is formed from the M1 layer of the die. The interface structure also includes via 142 between the gate contact 130 and the second M0 line 145, and V0 via 148 between the second M0 line 145 and the second M1 line 150. In this example, via 142 is a vertical interconnect structure connecting the gate contact 130 to the second M0 line 145, and via 148 is a vertical interconnect structure connecting the second M0 line 145 to the second M1 line 150. In FIGS. 1A-1C, a via between a gate contact and an M0 line is labeled "VG." In the discussion below, a via between a gate contact and an M0 line is referred to as a "VG via."

As shown in FIG. 1A, the second M0 line 145 and the second M1 line 150 are perpendicular to each other. Also, the second M0 line 145 runs parallel to the first M0 line 135, and the second M1 line 150 runs parallel to the first M1 line 140.

Referring to FIG. 1B, the structure 100 also includes an interface structure for the second source/drain contact 125. Note that the interface structures for the gate contact 130 and the first source/drain contact 115 are not shown in FIG. 1B in order to provide an unobstructed view of the interface structure for the second source/drain contact 125.

The interface structure includes a third M0 line 155 above the second source/drain contact 125, and a third M1 line 160 above the third M0 line 155. The third M0 line 155 is formed from the M0 layer of the die, and the third M1 line 160 is formed from the M1 layer of the die. The interface structure also includes VD via 152 between the second source/drain contact 125 and the third M0 line 155, and V0 via 158 between the third M0 line 155 and the third M1 line 160. In this example, VD via 152 is a vertical interconnect structure connecting the second source/drain contact 125 to the third M0 line 155, and V0 via 158 is a vertical interconnect structure connecting the third M0 line 155 to the third M1 line 160. As shown in FIG. 1B, the third M0 line 155 and the third M1 line 160 are perpendicular to each other.

Referring back to FIG. 1A, the first, second and third M0 lines 135, 145 and 155 run parallel to each other, and the first, second and third M1 lines 140, 150 and 160 run parallel to each other. The first M0 line 135 and the third M0 line 155 are spaced apart by a spacing (labeled "spacing" in FIG. 1A) in lateral direction 122. The spacing between the M0 lines 135 and 155 typically cannot be smaller than a minimum line spacing for the M0 line specified by a chip layout design rule.

Thus, the interface structures for the FinFET include M0 lines, M1 lines, VD vias, V0 vias and one or more VG vias. The addition of M0 lines and V0 vias in the interface structures and the finer geometries in advanced deep sub-micron processes result in increased parasitic series resistance. The increased parasitic resistance increases IR drops in the interface structures, which reduce the voltage headroom of the transistor, and therefore negatively impact performance. The increased parasitic resistance makes the design of ubiquitous circuit topologies, such as low-impedance I/O drivers, especially challenging. The parasitic resistance is only expected to get worse as dimensions scale down.

The parasitic resistance can be reduced by increasing the number of vias. However, the high metal routing density in the interface structures and chip layout design rule restrictions make it very difficult to accommodate additional vias to reduce parasitic resistance. For example, an additional VD via cannot be placed on the area of the first source/drain contact 115 referenced by reference number 170 in FIG. 1A. This is because the additional VD would require an M0 line above the area 170 of the first source/drain contact 115, which would interfere with the third M0 line 155 used for the second source/drain contact 125. For this reason, the VD via 132 of the first source/drain contact 115 and the VD via 152 of the second source/drain contact 125 are offset from each other in lateral direction 122, as shown in FIG. 1A.

Embodiments of the present disclosure extend the length of a contact (e.g., source/drain contact) beyond an active region of a transistor in order to increase the area of the contact. The increased area allows one or more additional vias (e.g., one or more VD vias) to be placed on the contact without violating the chip layout design rules. The one or more additional vias reduce parasitic resistance in the interface structure of the contact, thereby improving performance.

Figure 2A:
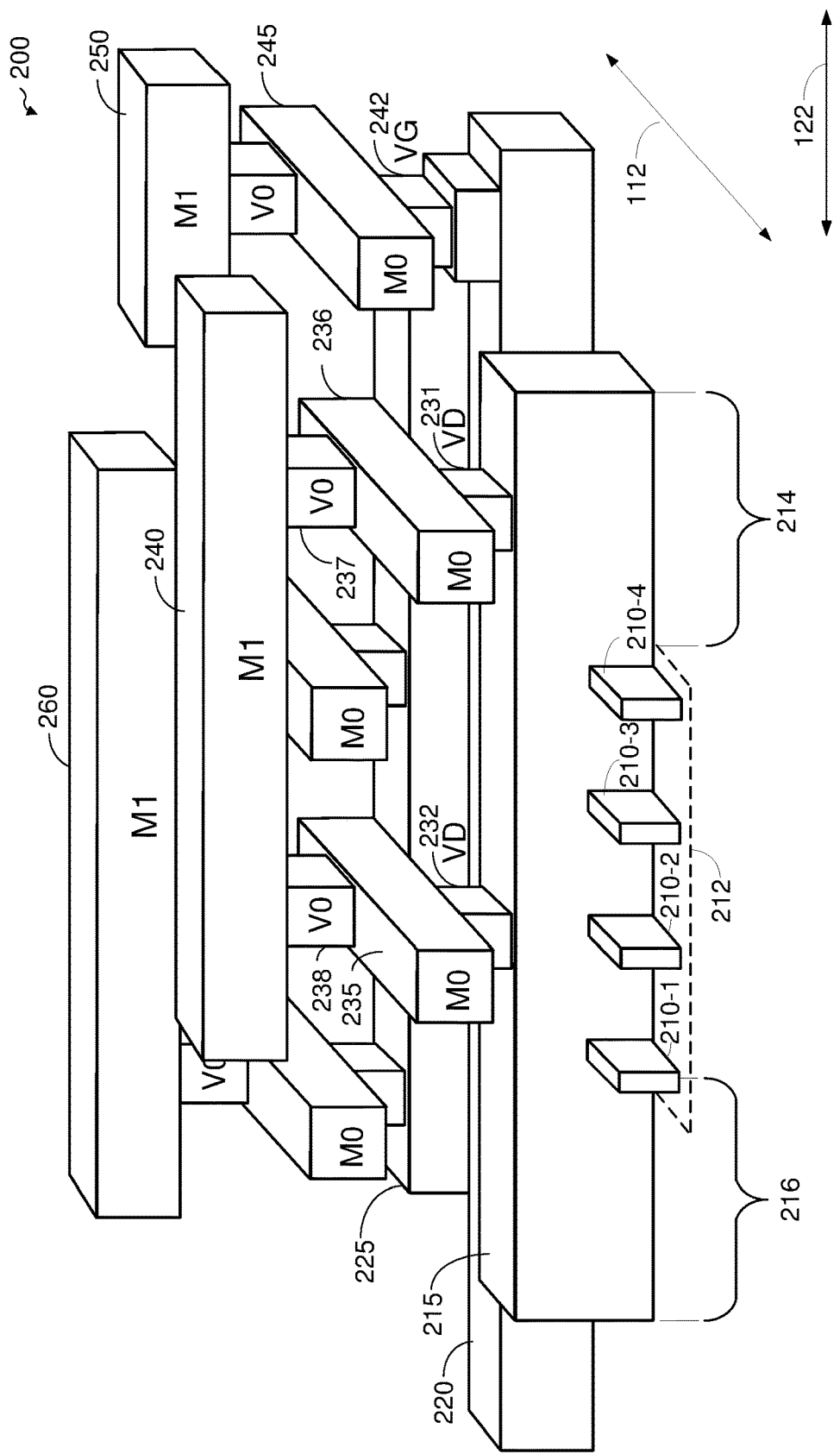
FIG. 2A shows a perspective view of a structure including a FinFET and interface structures for the FinFET with reduced parasitic resistance according to certain aspects of the present disclosure.
Figure 2B:
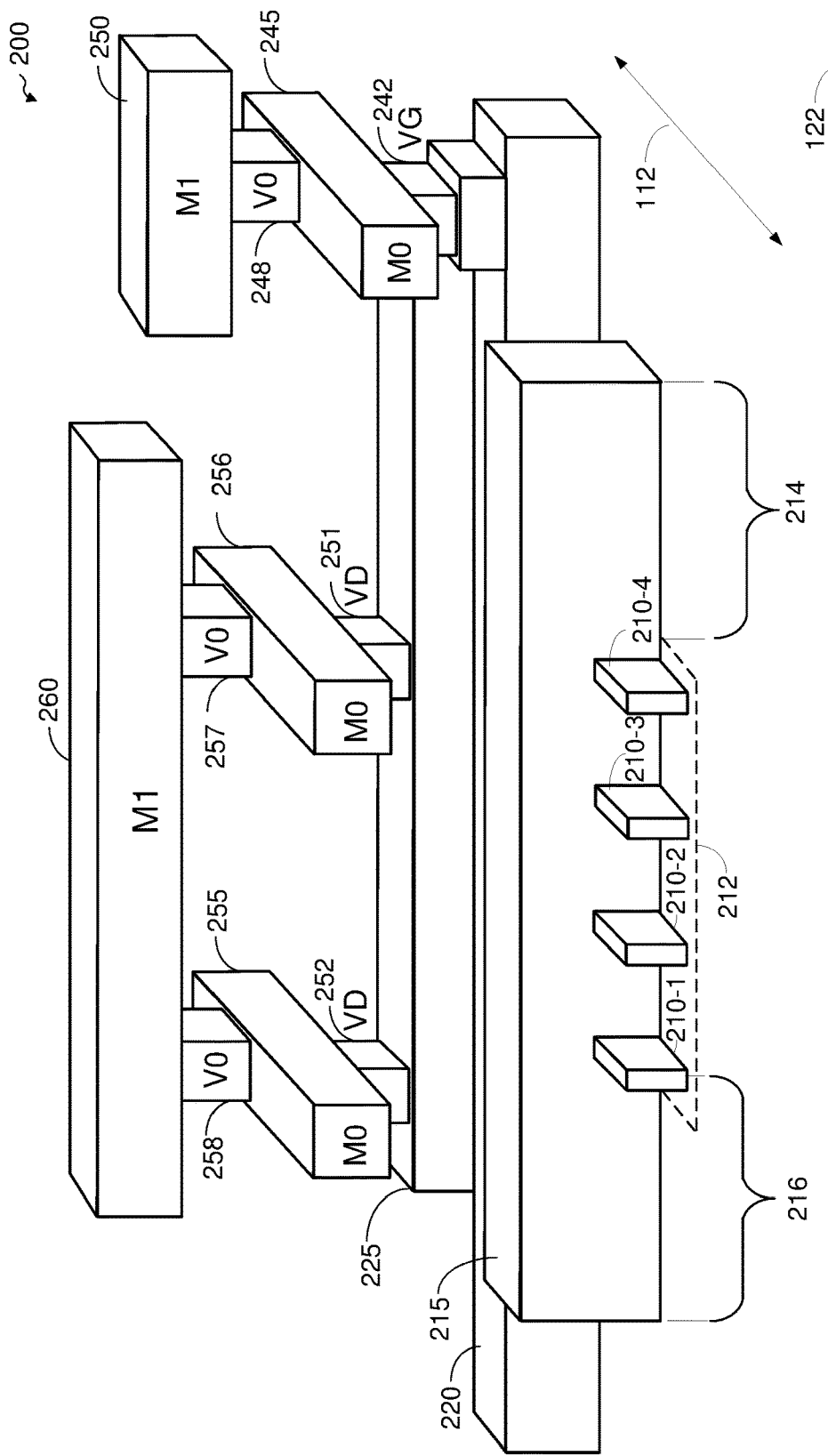
FIG. 2B shows a perspective view of the structure in FIG. 2A in which some of the interface structures shown in FIG. 2A are not shown in FIG. 2B in order to provide an unobstructed view of certain features of the structure.
Figure 2C:
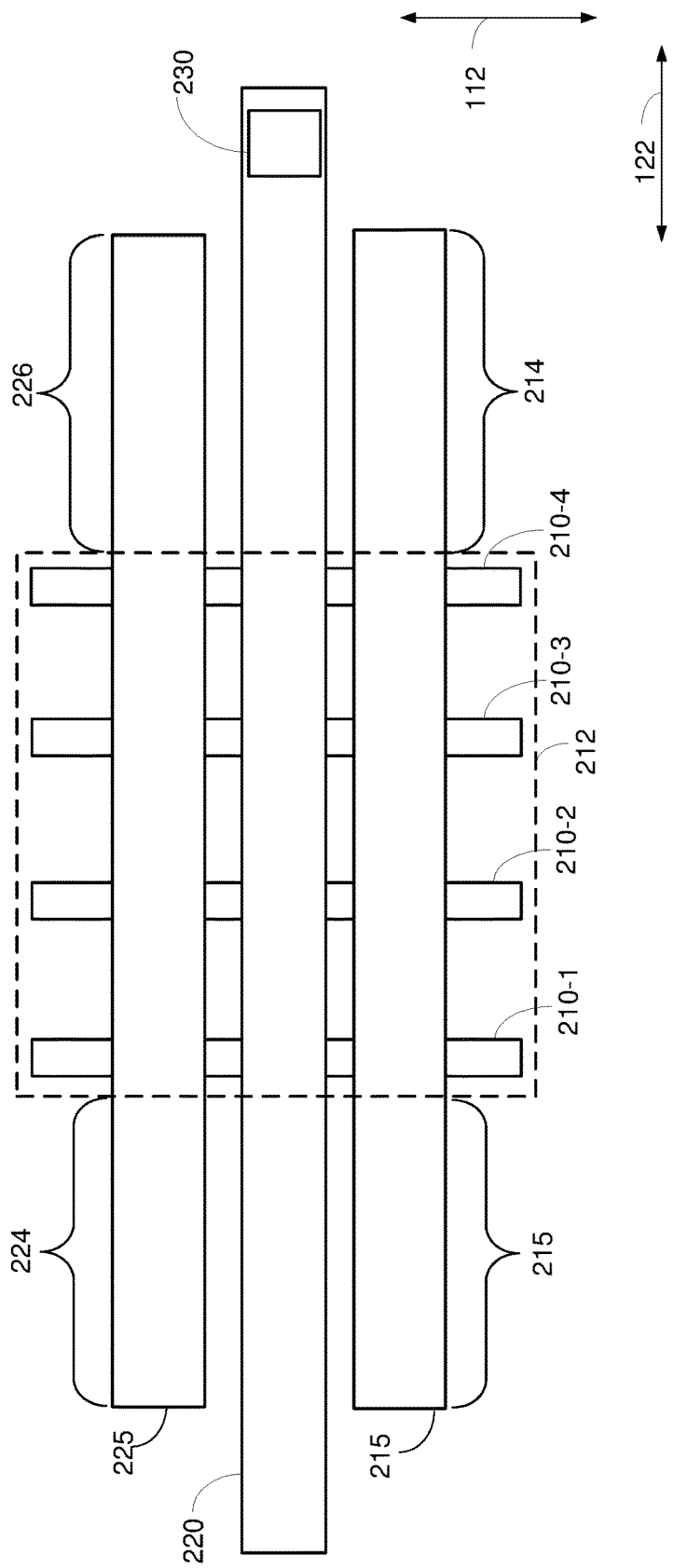
FIG. 2C shows a top view of the FinFET shown in FIGS. 2A and 2B according to certain aspects of the present disclosure.

In this regard, FIG. 2A-2C show a structure 200 according to certain aspects of the present disclosure. The structure 200 includes a FinFET and interface structures for interconnecting the FinFET with another transistor (e.g., within the same cell) and/or connecting the FinFET to upper metal layers in the back-end-of-line (BEOL) of the die.

The FinFET includes one or more fins 210-1 to 210-4, which extend in the lateral direction 112. The fins 210-1 to 210-4 may be the same as the fins 110-1 to 110-4 shown in FIGS. 1A-1C. The FinFET also includes a gate 220 formed over the middle portion of the fins 210-1 to 210-4 such that first and second side portions of the fins 210-1 to 210-4 extend from opposite sides of the gate 220. The gate 220 is similar to the gate 120 in FIGS. 1A-1C except that the length of the gate 220 is increased in the lateral direction 122, as discussed further below. The gate 220 may wrap around three or more sides of each fin (e.g., the top side and two opposite sides of each fin). The side portions of the fins 210-1 to 210-4 extending from the opposite sides of the gate 220 form the source and drain of the FinFET.

The FinFET may also include a thin dielectric layer (not shown) interposed between the fins 210-1 to 210-4 and the gate 220. The dielectric layer may include a hafnium-based oxide dielectric, or another dielectric material.

The structure 200 also includes a first source/drain contact 215 and a second source/drain contact 225 on opposite sides of the gate 220. The first source/drain contact 215 is similar to the first source/drain contact 115 in FIGS. 1A-1C except that the length of the first source/drain contact 215 is increased in lateral direction 122 to accommodate an additional VD via for reduced parasitic resistance, as discussed further below.

The first source/drain contact 215 is formed over the first side portion of the fins 210-1 to 210-4, and acts as a source or drain contact of the FinFET. The first source/drain contact 215 may contact one or more sides of each fin (e.g., the top side and two opposite sidewalls of each fin). The first source/drain contact 215 is made of one or more conductive materials (e.g., copper and/or another metal). The structure 200 may also include a sidewall spacer (not shown) between the gate 220 and the first source/drain contact 215.

The second source/drain contact 225 is similar to the second source/drain contact 125 in FIGS. 1A-1C except that the length of the second source/drain contact 225 is increased in lateral direction 122 to accommodate an additional VD via for reduced parasitic resistance, as discussed further below.

As shown in FIGS. 2A-2C, the second source/drain contact 225 is located on the opposite side of the gate 220 as the first source/drain contact 215. The second source/drain contact 225 is formed over the second side portion of the fins 210-1 to 210-4, and acts as a source or drain contact of the FinFET. The second source/drain contact 225 may contact one or more sides of each fin (i.e., the top side and two opposite sidewalls of each fin). The second source/drain contact is made of one or more conductive materials (e.g., copper or another metal). The structure 200 may include a sidewall spacer (not shown) between the gate 220 and the second source/drain contact 225.

The structure 200 also includes a gate contact 230 formed on top of the gate 220. The gate contact 230 is made of one or more conductive materials (e.g., copper and/or another metal).

FIG. 2C shows a top view of the FinFET, the first source/drain contact 215, the second source/drain contact 225, and the gate contact 230. As shown in FIG. 2C, the fins 210-1 to 210-4 extend laterally from opposite sides of the gate 220. The gate 230 is formed over the middle portion of the fins, the first source/drain contact 215 is formed over the first side portion of the fins, and the second source/drain contact 225 is formed over the second side portion of the fins.

As shown in FIGS. 2A-2C, the first source/drain contact 215 includes a first extended portion 214 that extends beyond one edge of an active region 212 of the FinFET. In this example, the active region 212 spans the fins 210-1 to 210-4 in lateral direction 122 and lateral direction 112. The first source/drain contact 215 also includes a second extended portion 216 that extends beyond an edge of the active region 212 that is opposite the edge from which the first extended portion 214 extends. The extended portions 214 and 216 of the first source/drain contact 215 do not overlap the fins 210-1 to 210-4. Although the first source/drain contact 215 includes two extended portions in this example, it is to be understood that the first source/drain contact may include only one of the extended portions. As discussed above, the first extended portion 214 increases the area of the first source/drain contact 215, allowing an additional VD via to be placed on the first source/drain contact 215 for reduced parasitic resistance.

The second source/drain contact 225 includes a first extended portion 224 that extends beyond one edge of the active region 212 of the FinFET, and a second extended portion 226 that extends beyond an edge of the active region 212 that is opposite the edge from which the first extended portion 224 extends (refer to FIG. 2C). The extended portions 224 and 226 of the second source/drain contact 225 do not overlap the fins 210-1 to 210-4. Although the second source/drain contact 225 includes two extended portions in this example, it is to be understood that the second source/drain contact may include only one of the extended portions.

As discussed above, the first extended portion 224 increases the area of the second source/drain contact 225, allowing an additional VD via to be placed on the second source/drain contact 225 for reduced parasitic resistance.

The gate 220 in FIGS. 2A-2C is longer than the gate 120 in FIGS. 1A-1C. This is done in order to accommodate the extended portions of the first and second source/drain contacts 215 and 225. Thus, the first and second source/drain contacts 215 and 225 and the gate 220 are extended in lateral direction 122 compared with the first and second source/drain contacts 115 and 125 and the gate 120 in FIGS. 1A-1C.

Referring to FIG. 2A, the structure 200 includes an interface structure for the first source/drain contact 215. As discussed further, the interface structure for the first source/drain contact 215 includes two VD vias to reduce parasitic resistance.

The interface structure includes a first M0 line 235 above the first source/drain contact 215, and a first M1 line 240 above the first M0 line 235. The first M0 line 235 is formed from the M0 layer of the die, and the first M1 line 240 is formed from the M1 layer of the die. As shown in FIG. 2A, the length of the first M0 line 235 runs in lateral direction 112, and the length of first M1 line 240 runs in lateral direction 122, which is perpendicular to direction 112.

The interface structure also includes VD via 232 between the first source/drain contact 215 and the first M0 line 235, and V0 via 238 between the first M0 line 235 and the first M1 line 240. VD via 232 is a vertical interconnect structure connecting the first source/drain contact 215 to the first M0 line 235, and the V0 via 238 is a vertical interconnect structure connecting the first M0 line 235 to the first M1 line 240. In the example shown in FIG. 2A, VD via 232 and V0 via 238 lie within the active region 212, and overlap one or more of the fins 210-1 to 210-4.

The interface structure for the first source/drain contact 215 also includes a second M0 line 236 above the first source/drain contact 215. The second M0 line 236 is formed from the M0 layer of the die, and runs parallel with the first M0 line 235. The interface structure also includes VD via 231 between the first source/drain contact 215 and the second M0 line 236, and V0 via 237 between the second M0 line 236 and the first M1 line 240. VD via 231 is a vertical interconnect structure connecting the first source/drain contact 215 to the second M0 line 236, and the V0 via 237 is a vertical interconnect structure connecting the second M0 line 236 to the first M1 line 240.

In the example shown in FIG. 2A, VD via 231 and V0 via 237 lie within the first extended portion 214 of the first source/drain contact 215. The first extended portion 214 provides enough contact area to accommodate VD via 231 while complying with chip layout design rules (e.g., minimum spacing between adjacent M0 lines). Thus, the interface structure in this example includes two VD vias (i.e., VD vias 231 and 232). This substantially reduces parasitic resistance compared with the interface structure for the first source/drain contact 115 in FIG. 1A, which only includes one VD via (i.e., VD via 132). In the example shown in FIG. 2A, VD via 231 does not overlap a fin.

Referring to FIG. 2B the structure 200 includes an interface structure for the second source/drain contact 225. Note that the interface structure for the first source/drain contact 215 is not shown in FIG. 2B in order to provide an unobstructed view of the interface structure for the second source/drain 225. As discussed further below, the interface structure for the second source/drain 225 includes two VD vias to reduce parasitic resistance.

The interface structure includes a third M0 line 255 above the second source/drain contact 225, and a second M1 line 260 above the third M0 line 255. The third M0 line 255 is formed from the M0 layer of the die, and the second M1 line 260 is formed from the M1 layer of the die. As shown in FIG. 2B, the length of the third M0 line 255 runs in lateral direction 112, and the length of second M1 line 260 runs in lateral direction 122, which is perpendicular to direction 112.

The interface structure also includes VD via 252 between the second source/drain contact 225 and the third M0 line 255, and V0 via 258 between the third M0 line 255 and the second M1 line 260. VD via 252 is a vertical interconnect structure connecting the second source/drain contact 225 to the third M0 line 255, and the V0 via 258 is a vertical interconnect structure connecting the third M0 line 255 to the second M1 line 260. In the example shown in FIG. 2B, VD via 252 and V0 via 258 lie within the first extended portion 224 of the second source/drain contact 225.

The interface structure for the second source/drain contact 225 also includes a fourth M0 line 256 above the second source/drain contact 225. The fourth M0 line 256 is formed from the M0 layer of the die, and runs parallel with the third M0 line 235. The interface structure also includes VD via 251 between the second source/drain contact 225 and the fourth M0 line 256, and V0 via 257 between the fourth M0 line 256 and the second M1 line 260. VD via 251 is a vertical interconnect structure connecting the second source/drain contact 225 to the fourth M0 line 256, and the V0 via 257 is a vertical interconnect structure connecting the fourth M0 line 256 to the second M1 line 260. VD via 251 and via 257 lie within the active region 212.

As discussed above, VD via 252 and V0 via 258 lie within the first extended portion 224 of the second source/drain contact 225. The first extended portion 224 provides enough contact area to accommodate VD via 252 while complying with chip layout design rules (e.g., minimum spacing between adjacent M0 lines). Thus, the interface structure in this example includes two VD vias (i.e., VD vias 251 and 252). This substantially reduces parasitic resistance compared with the interface structure for the second source/drain contact 125 in FIG. 1A, which only includes one VD via (i.e., VD via 152).

The structure 200 also includes an interface structure connected to the gate contact 230. The interface structure for the gate contact 230 includes a fifth M0 line 245 above the gate contact 230, and a third M1 line 250 above the fifth M0 line 245. The fifth M0 line 245 is formed from the M0 layer of the die, and the third M1 line 250 is formed from the M1 layer of the die. The interface structure also includes via 242 between the gate contact 230 and the fifth M0 line 245, and V0 via 248 between the fifth M0 line 245 and the third M1 line 250. In this example, via 242 is a vertical interconnect structure connecting the gate contact 230 to the fifth M0 line 245, and via 248 is a vertical interconnect structure connecting the fifth M0 line 245 to the third M1 line 250.

As shown in FIG. 2A, the first, second, third fourth and fifth M0 lines 235, 236, 255, 256 and 245 run parallel to each other, and the first, second and third M1 lines 240, 260 and 250 run parallel to each other. The first, second, third, fourth and fifth M0 lines 235, 236, 255, 256 and 245 are spaced apart from one another in lateral direction 122, in which the spacing between adjacent M0 lines is no smaller than a minimum line spacing specified by a chip layout design rule for the die.

As shown in FIG. 2A, the first extended portion 214 of the first source/drain contact 215 and the first extended portion 224 of the second source/drain contact 225 are on opposite sides of the active region 212 (opposite sides of the fins 210-1 to 210-4).

As shown in FIG. 2A, the VD vias 231 and 232 of the first source/drain contact 215 are offset from the VD vias 251 and 252 of the second source/drain contact 225 in the lateral direction 122.

It is to be appreciated that the M0 lines shown in FIGS. 2A and 2B may extend further in lateral direction 112 than shown in FIGS. 2A and 2B. Also, it is to be appreciated that the M1 lines shown in FIGS. 2A and 2B may extend further in lateral direction 122 than shown in FIGS. 2A and 2B. Further, it is to be appreciated that the fins 210-1 to 210-4 may extend further in lateral direction 112 than shown in FIGS. 2A-2C.

Thus, embodiments of the present disclosure reduce parasitic resistance by extending the lengths of the source/drain contacts 215 and 225 beyond the active region 212. This increases the contact areas of the contact 215 and 225, allowing additional VD vias to be placed on the contacts 215 and 225 for reduced parasitic resistance.

The reduced resistance results in higher performance (e.g., higher gate over drive). The reduced resistance also reduces IR droops in the interface structures for the contacts, resulting in improved voltage headroom or regain voltage headroom. The reduced resistance also reduces the impedance calibration range since the contact interface resistance contributes less to total resistance.

Aspects of the present disclosure also provide improved manufacturability (i.e., less sensitivity to contact interface resistance which typically exhibits wide variation due to poorer control of interface quality which primarily dictates contact resistance). For example, using multiple VD vias for a source/drain contact provides improved manufacturability compared with using one VD via for the source/drain contact. This is because an interface structure with multiple VD vias may still work if one of the VD vias is defective, whereas an interface structure with only one VD via will not work if the one VD via is defective.

Aspects of the present disclosure also reduce routing congestion that might otherwise introduce more design rule check (DRC) issues. For example, extending the lengths of the contacts provides more area for routing.

Aspects of the present disclosure have some drawbacks. For example, extending the lengths of the contacts incurs penalties in local area to account for the extension. Also, extending the lengths of the source/drain contacts and the gate may increase parasitic capacitance between the source/drain contacts and the gate. However, these drawbacks are outweighed by the reduced series resistance and reduced sensitivity to variation in resistance provided by aspects of the present disclosure.

Figure 2D:
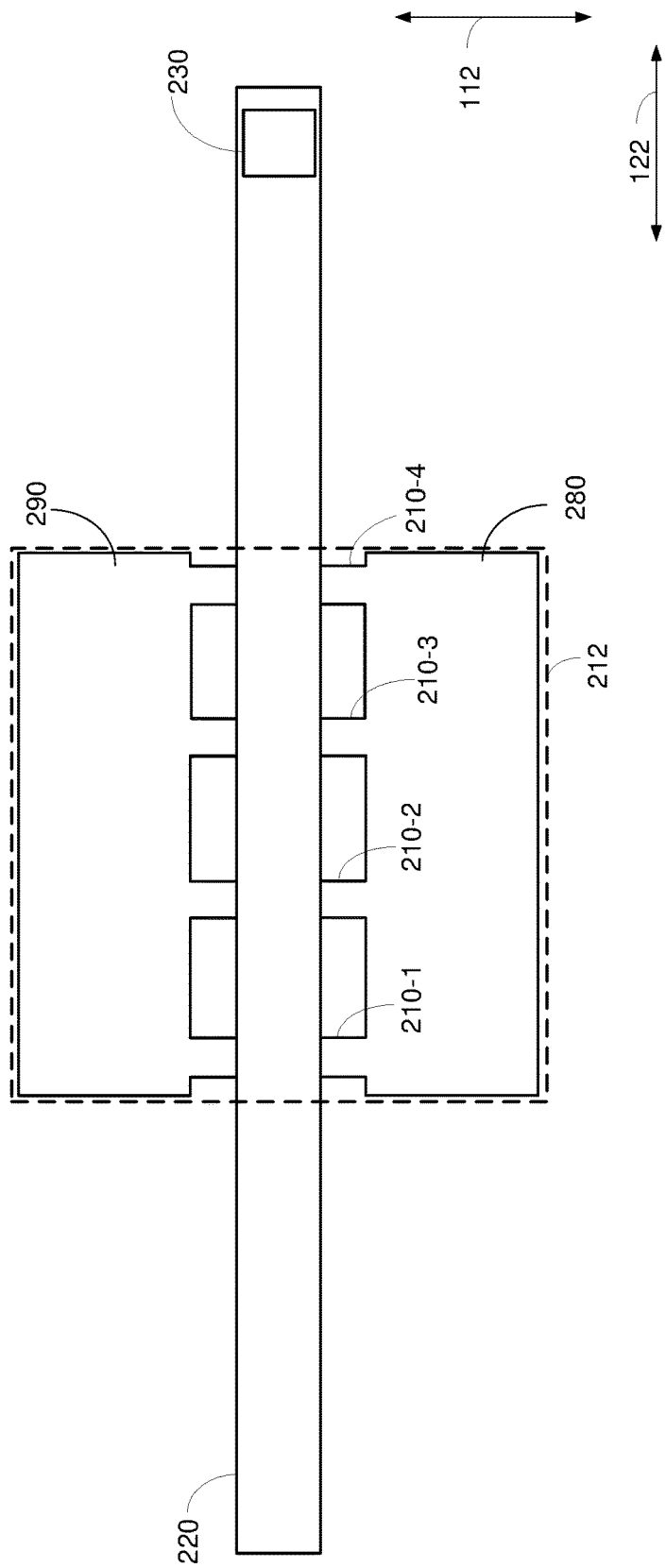
FIG. 2D shows an example in which portions of the fins in the FinFET are merged according to certain aspects of the present disclosure.

In FIG. 2C, the fins 210-1 to 210-4 are depicted as being discrete structures throughout their entire lengths in direction 112. However, it is to be appreciated that embodiments of the present disclosure are not limited to this example. For instance, FIG. 2D shows an example in which the fins are merged on opposite sides of the gate 230 to form first and second merged portions 280 and 290. In this example, the first source/drain contact 215 (not shown in FIG. 2D) may be formed over the first merged portion 280, and the second source/drain contact 225 (not shown in FIG. 2D) may be formed over the second merged portion 290. The merged portions 280 and 290 may be formed using an epitaxial growth process in which silicon or another material is grown on the fins to merge the fins. The epitaxial growth may use the same material as the fins or a different material. As shown in FIG. 2D, the merged portions 280 and 290 lie within the active region 212. The fins are separate (i.e., not merged) under the gate 220.

Figure 2E:
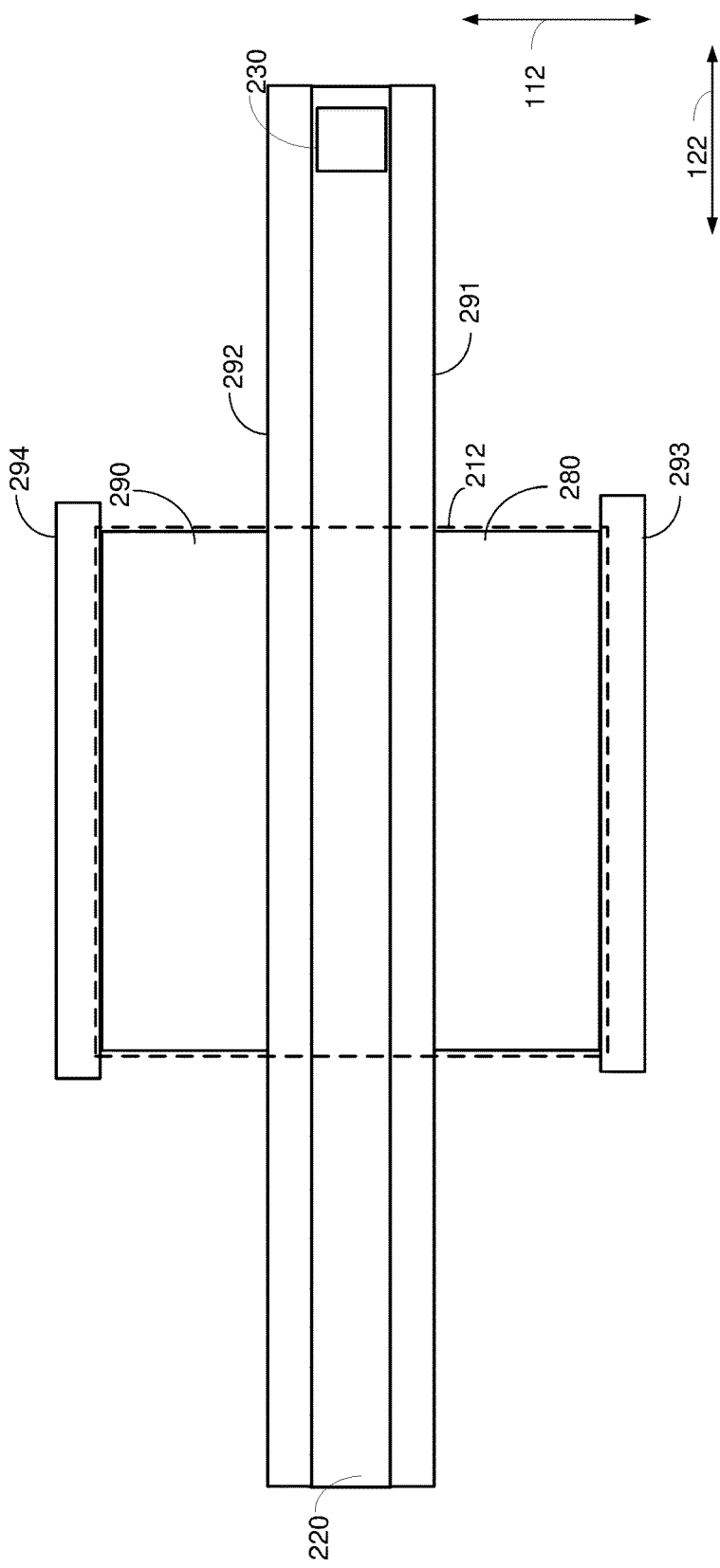
FIG. 2E shows an example of sidewall spacers used to define the boundaries of the merged portions of the fins according to certain aspects of the present disclosure.

The merged portions 280 and 290 may be defined at least partially using sidewall spacers. In this regard, FIG. 2E shows examples of sidewall spacers 291-294 that may be used to at least partially define the merged portions 280 and 290. The sidewall spacers include gate sidewall spacers 291 and 292 formed on opposite sides of the gate 220. These sidewall spacers may be the same as the sidewall spacers discussed above for preventing the source/drain contacts 212 and 225 from shorting to the gate 220. The sidewall spacers also include sidewall spacers 293 and 294 positioned at opposite ends of the fins, as shown in FIG. 2E. Each of these sidewall spacers 293 and 294 may be formed on a sidewall of a respective dummy poly structure (not shown). The sidewall spacers 291-294 are formed before the epitaxial growth that forms the merged portions 280 and 290. During epitaxial growth, the sidewall spacers 291-294 help confine the epitaxial growth within the desired boundaries for the merged portions 280 and 290. It is to be appreciated that embodiments of the present disclosure are not limited to this example, and that the merged portions 280 and 290 may be formed using other fabrication techniques. Also, it is to be appreciated that the sidewall spacers may extend further in lateral direction 122 than shown in FIG. 2E.

A multi-finger transistor includes multiple gates arranged in parallel, in which each gate is referred to as a finger. The multi-finger may be modeled as multiple transistors coupled in parallel, in which each gate (finger) corresponds to one of the transistors. Multi-finger transistors are commonly used for I/O drivers and/or other types of circuits.

The parasitic resistance of a multi-finger transistor can be reduced by adding more fingers to the multi-finger transistor. However, this can substantially increase power consumption and area of the multi-finger transistor. Aspects of the present disclosure are able to reduce parasitic resistance of a multi-finger transistor without having to add more fingers to the multi-finger transistor, as discussed further below.

Figure 3A:
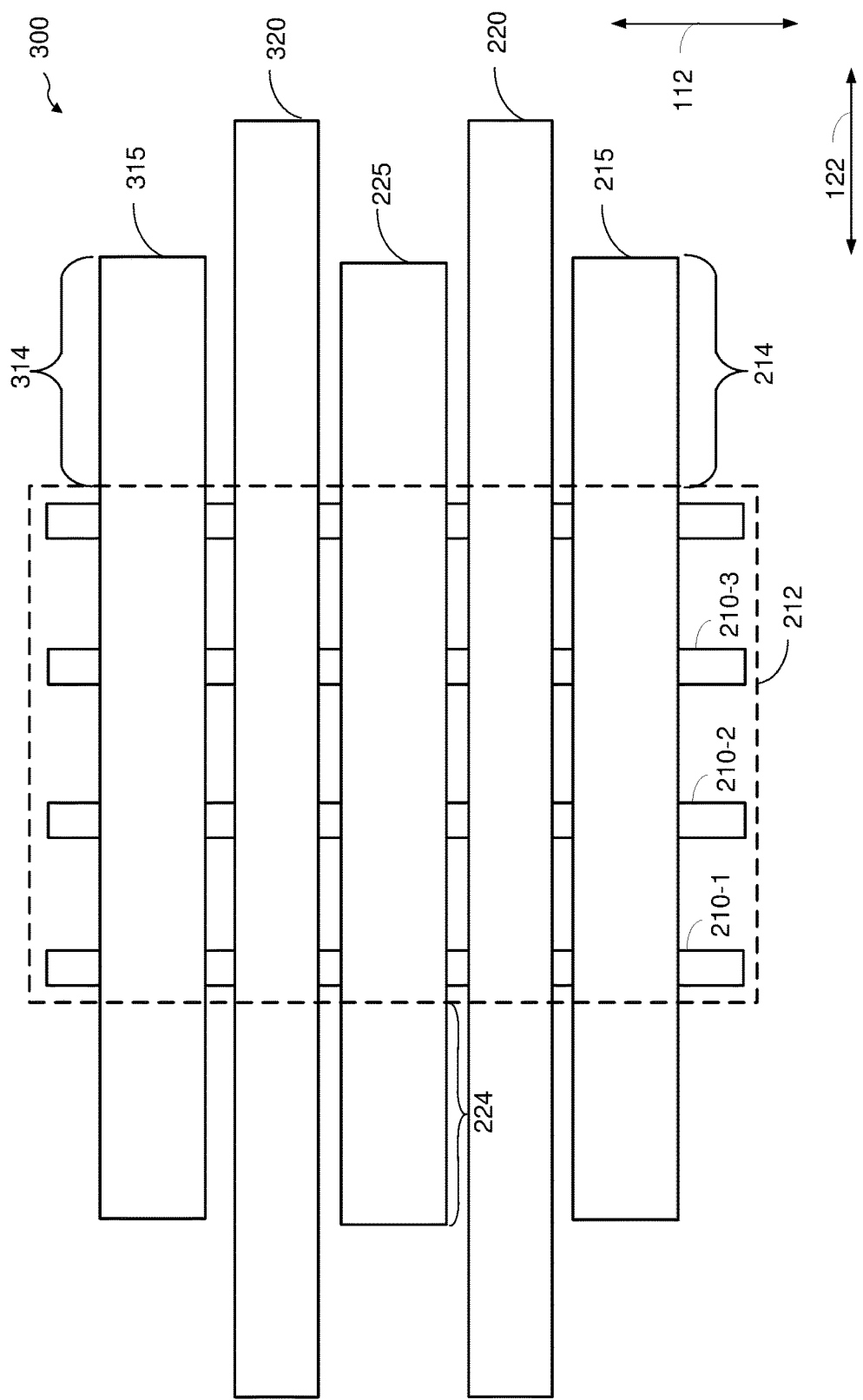
FIG. 3A shows a top view of a multi-finger transistor according to certain aspects of the present disclosure.

FIG. 3A shows a top view of a two-finger transistor 310 according to aspects of the present disclosure. The two-finger transistor 310 includes the fins 210-1 to 210-4 shown in FIGS. 2A-2B, which extend in lateral direction 112. The two-finger transistor 310 also includes the first source/drain contact 215, the gate 220, and the second source/drain contact 225 shown in FIGS. 2A-2B, which extend in lateral direction 122. In the discussion below, the gate 220 is referred to as the first gate 220.

The two-finger transistor 310 also includes a second gate 320 and a third source/drain contact 315. The second gate 320 is formed over a portion of the fins 210-1 to 210-4. The second gate 320 may wrap around three or more sides of each fin (e.g., the top side and two opposite sidewalls of each fin). The second gate 320 runs parallel to the first gate 220. As shown in FIG. 3A, the second source/drain contact 225 is between the first and second gates 220 and 320.

The third source/drain contact 315 is located on the opposite side of the second gate 320 as the second source/drain contact 225. The third source/drain contact 315 is formed over a portion of the fins 210-1 to 210-4, and may be made of one or more conductive materials (e.g., copper and/or another metal). The third source/drain contact 315 includes a first extended portion 314 that extends beyond one edge of the active region 212, as shown in FIG. 3A. The first extended portion 314 does not overlap the fins 210-1 to 210-4. As discussed further below, the first extended portion 314 increases the area of the third source/drain contact 315, allowing more than one VD via to be placed on the third source/drain contact 315 for reduced parasitic resistance. It is to be appreciated that the portions of the fins under the first, second and third source/drain contacts 215, 225 and 315 may be merged, as discussed above with reference to FIG. 2D. The portions of the fins under the first and second gates 220 and 320 are separate (i.e., not merged).

Figure 3B:
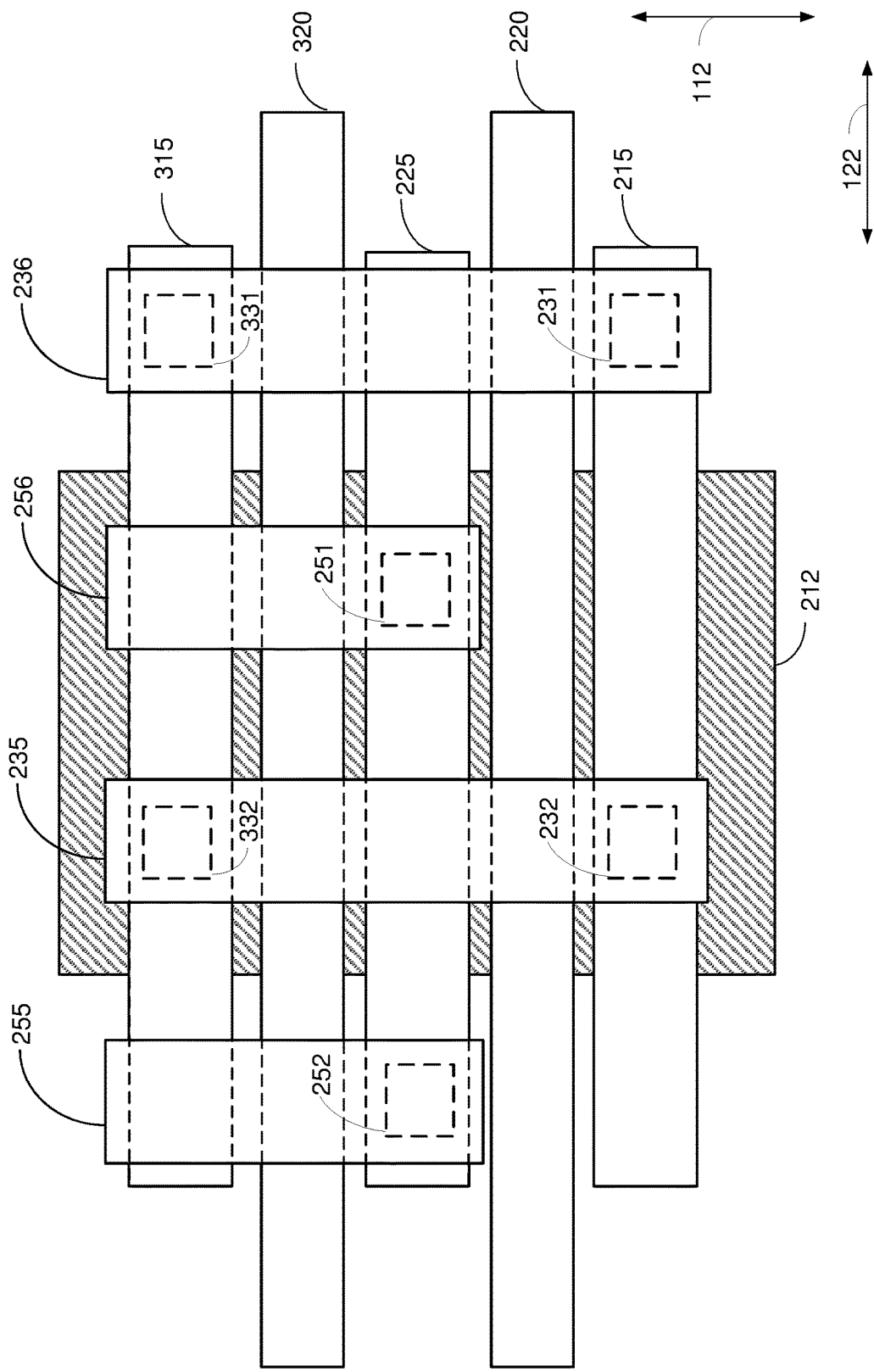
FIG. 3B shows a top view of interface structures with reduced parasitic resistance for the multi-finger transistor according to certain aspects of the present disclosure.
Figure 3C:
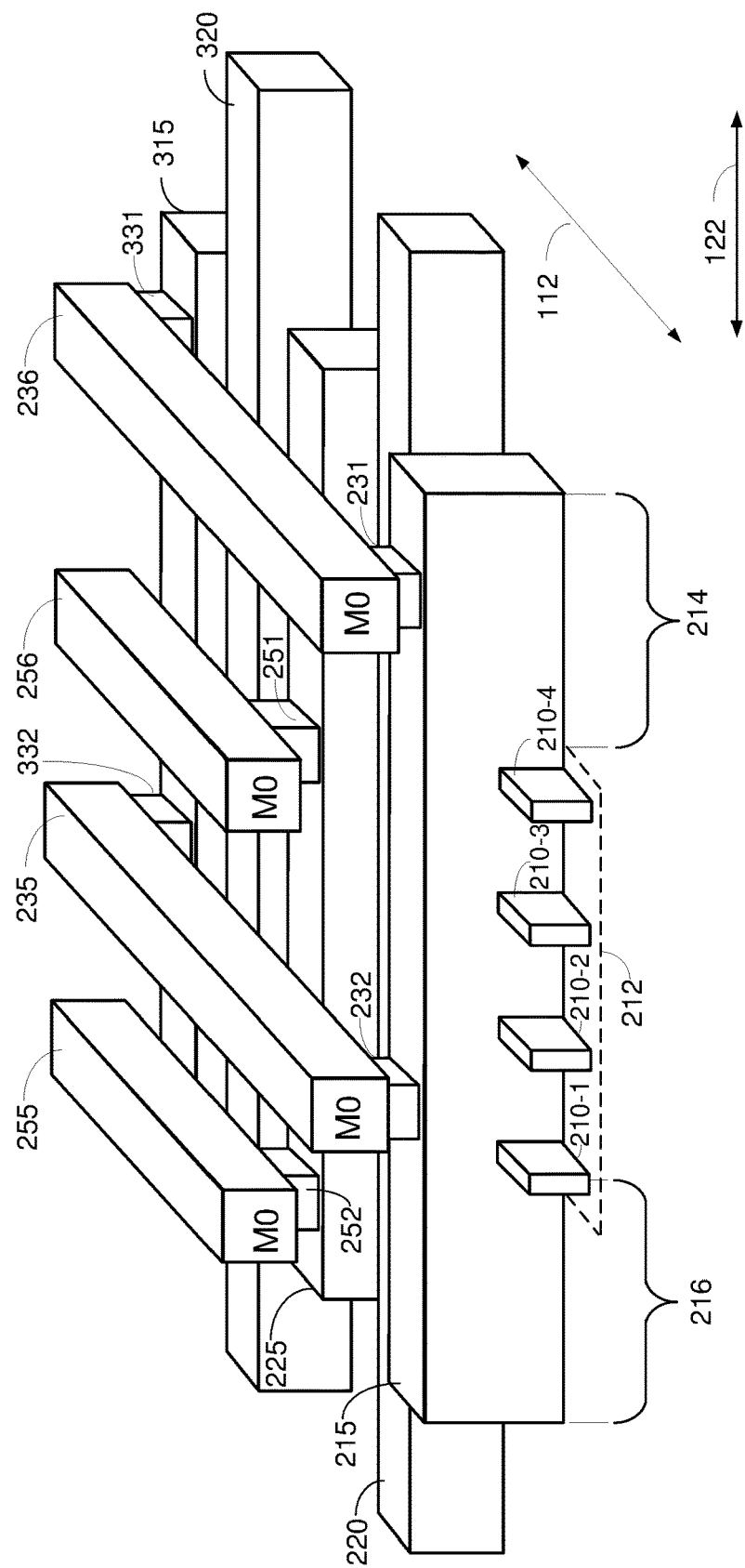
FIG. 3C shows a perspective view of the interface structures and the multi-finger transistor shown in FIG. 3B.

FIG. 3B shows a top view of the contact interface structures for the two-finger transistor 310 up to the M0 layer according to aspects of the present disclosure. Note that the individual fins are not shown in FIG. 3B for ease of illustration. FIG. 3C shows a perspective view of the interface structures for the two-finger transistor shown in FIG. 3B.

The contact interface structures for the two-finger transistor include the first, second, third and fourth M0 lines 235, 236, 255 and 256. As shown in FIGS. 3B and 3C, the first and second M0 lines 235 and 236 extend over the third source/drain contact 315 and the first and second gates 220 and 320 in direction 112.

The contact interface structure for the first source/drain contact 215 includes VD via 232 connecting the first source/drain contact 215 to the first M0 line 235, and VD via 231 connecting the first source/drain contact 215 to the second M0 line 236. VD via 232 lies within the active region 212, and VD via 231 lies within the first extended portion 214 of the first source/drain contact 215. In FIG. 3B, the VD vias are shown in dashed lines to indicated that they are under the M0 lines.

The contact interface structure for the third source/drain contact 315 includes VD via 332 connecting the third source/drain contact 315 to the first M0 line 235, and VD via 331 connecting the third source/drain contact 315 to the second M0 line 236. VD via 332 lies within the active region 212, and VD via 331 lies within the first extended portion 314 of the third source/drain contact 315. In this example, the first and third source/drain contacts 215 and 315 are shorted together through the first and second M0 lines 235 and 236. This is because the first M0 line 235 is connected to the first and third source/drain contacts 215 and 315 by vias 232 and 332, respectively, and the second M0 line 236 is connected to the first and third source/drain contacts 215 and 315 by vias 231 and 331, respectively.

The contact interface structure for the second source/drain contact 225 includes VD via 252 connecting the second source/drain contact 225 to the third M0 line 255, and VD via 251 connecting the second source/drain contact 225 to the fourth M0 line 256.

As shown in FIG. 3B, the VD vias 232 and 231 of the first source/drain contact 215 are approximately aligned with the VD vias 332 and 331 of the third source/drain contact 315 in direction 122, and are offset from the VD vias 252 and 251 of the second source/drain contact 315 in direction 122.

The extended portions of the source/drain contacts 215, 225 and 315 expand the contact areas of the source/drain contacts 215, 225 and 315, allowing additional VD vias 231, 331 and 252 to be placed on the source/drain contacts for reduced parasitic resistance, as shown in FIGS. 3B and 3C. Without the extended portions, the interface structures would be limited to VD vias 232, 332 and 251 within the active region 212.

Figure 4:
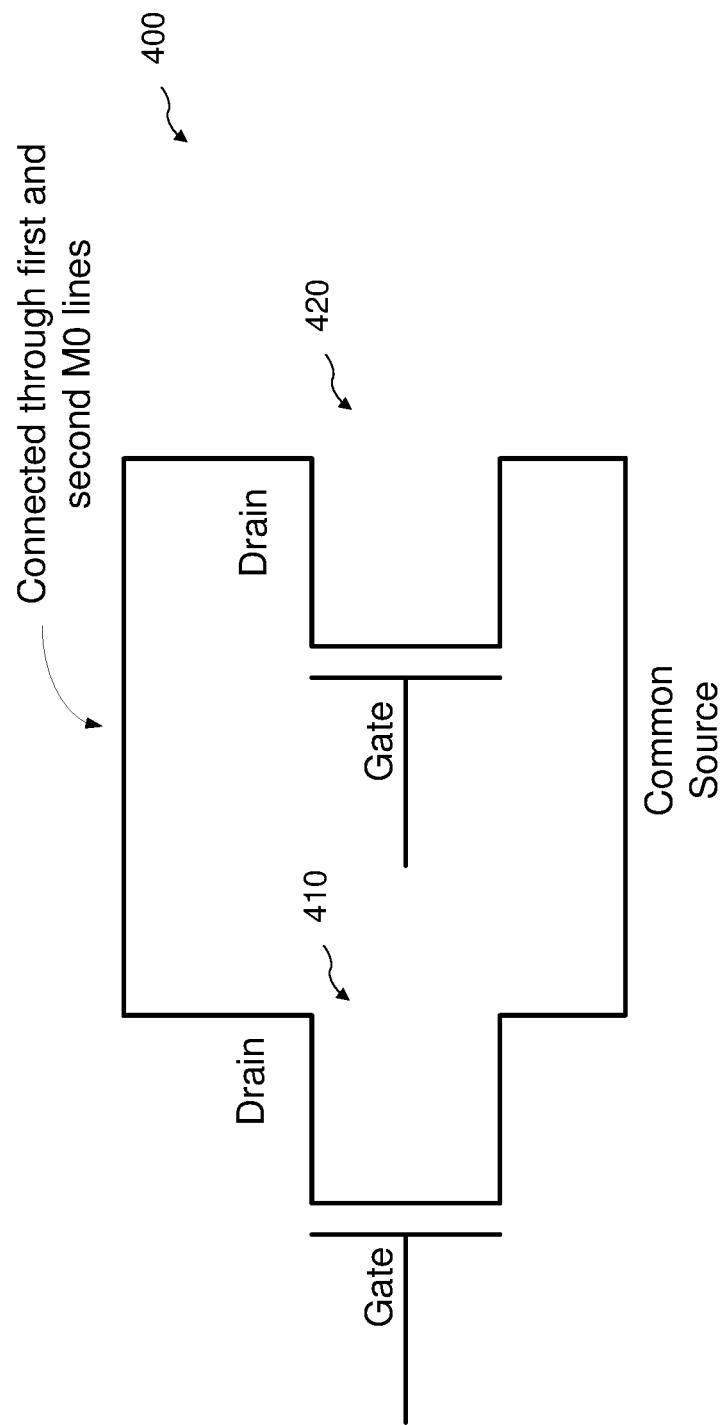
FIG. 4 shows a circuit model of the multi-finger transistor according to certain aspects of the present disclosure.

FIG. 4 shows an exemplary circuit model 400 of the two-finger transistor. In this example, the two-finger transistor is modeled as first and second transistors 410 and 420 connected in parallel. The first transistor 410 has a gate corresponding to the first gate 220, a drain corresponding to the first source/drain contact 215, and a source corresponding to the second source/drain contact 225. The second transistor 420 has a gate corresponding to the second gate 320, a drain corresponding to the third source/drain contact 315, and a source corresponding to the second source/drain contact 225. In this example, the second source/drain contact 225 is shared by the first and second transistors 410 and 420, and therefore the first and second transistors 410 and 420 have a common source. Also, the drains of the first and second transistors 410 and 420 are connected together at the M0 layer through the first and second M0 lines 235 and 236, as discussed above.

Figure 3D:
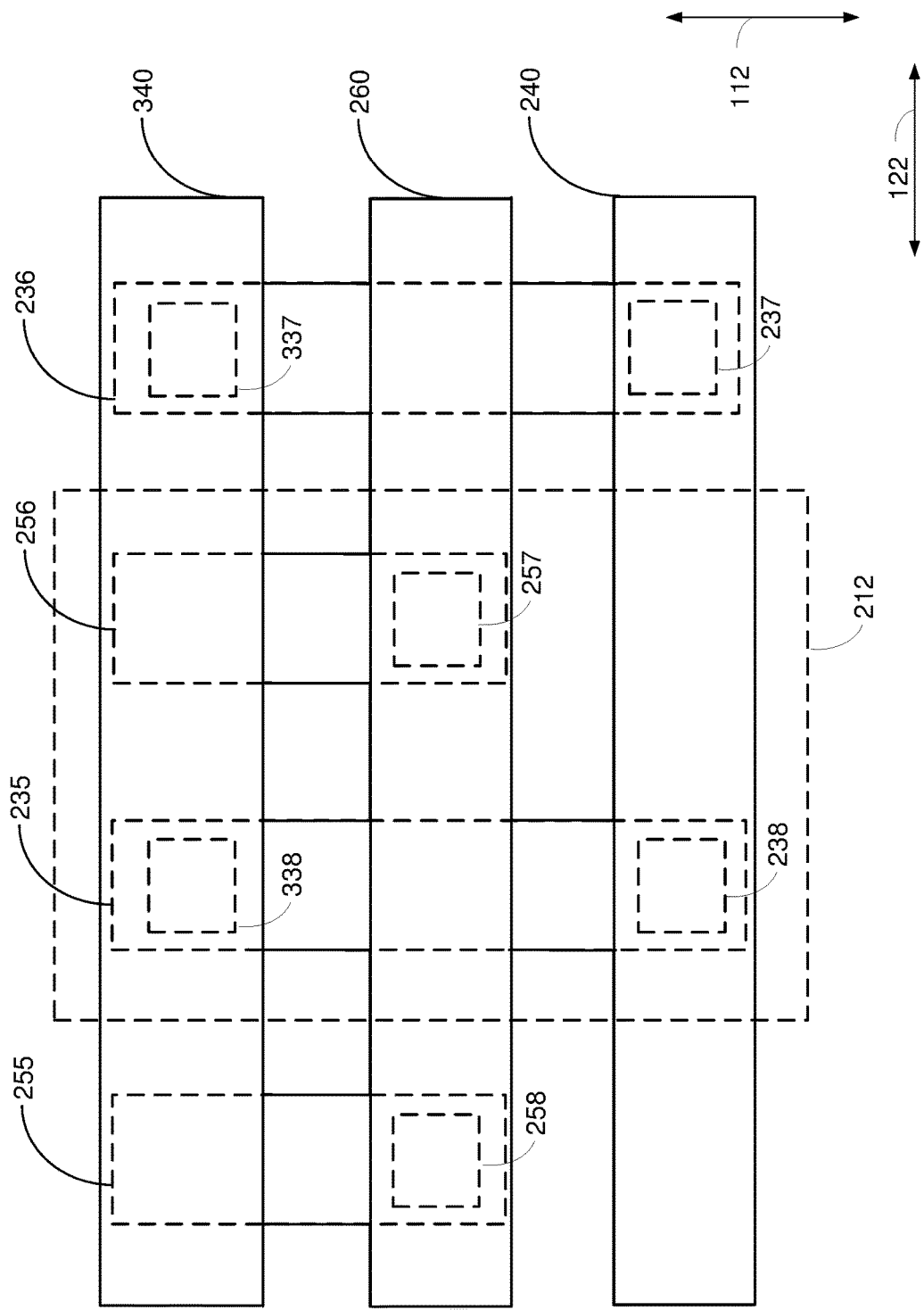
FIG. 3D shows a top view of the interface structures from a metal-0 (M0) layer to a metal-1 (M1) layer according to certain aspects of the present disclosure.

FIG. 3D shows a top view of the contact interface structures for the two-finger transistor 310 from the M0 layer to the M1 layer according to aspects of the present disclosure. Note that structures below the M0 layer are not shown in FIG. 3D for ease of illustration.

The contact interface structures for the two-finger transistor include the first and second M1 lines 240 and 260 shown in FIG. 2A, and a third M1 line 340. The third M1 line 340 may extend in the lateral direction 122 above the third source/drain contact 315 (shown in FIGS. 3B and 3C). In FIG. 3D, structures below the M1 lines are shown in dashed lines. The boundary of the active region 212 is also shown using dashed lines.

The contact interface structures also include V0 via 238 connecting the first M0 line 235 to the first M1 line 240, and V0 via 237 connecting the second M0 line 236 to the first M1 line 240. The contact interface structures may also include V0 via 338 connecting the first M0 line 235 to the third M1 line 340, and V0 via 337 connecting the second M0 line 236 to the third M1 line 340. The contact interface structures may further include V0 via 258 connecting the third M0 line 255 to the second M1 line 260, and V0 via 257 connecting the fourth M0 line 256 to the second M1 line 260.

Note that the interface structures for the gates 220 and 320 are not shown in FIGS. 3B-3D. The interface structure for the first gate 220 may be the same as the gate interface structure for the first gate 220 shown in FIG. 2A. The interface structure for the second gate 320 may be a duplicate of the interface structure for the first gate 220. In this example, the fifth M0 line 245 may extend to the second gate 320 such that the first gate 220 and the second gate 320 are connected through the fifth M0 line 245.

It is to be appreciated that the M0 and M1 layers discussed above are not limited to the terms "M1" and "M1." For example, if the bottom-most interconnect metal layer starts with a metal-layer index of one instead of zero, then the M0 and M1 layers may be referred to as the M1 and M2 layers, respectively.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation.

In this disclosure, the term "connect" means electrically connect, and does not exclude the possibility of an intervening conductive element (e.g., thin conductive interface). For example, an element may connect to another element by making direct electrical contact with the other element, or through an intervening conductive element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A die, comprising:
   one or more fins;
   a first gate formed over a first portion of the one or more fins;
   a first source/drain contact formed over a second portion of the one or more fins, wherein the first source/drain contact includes an extended portion that does not overlap the one or more fins;
   a second source/drain contact formed over a third portion of the one or more fins;
   a second gate formed over a fourth portion of the one or more fins, wherein the second source/drain contact is between the first gate and the second gate;
   a third source/drain contact formed over a fifth portion of the one or more fins, wherein the third source/drain contact includes an extended portion that does not overlap the one or more fins;
   first and second metal lines formed from a first metal layer, wherein the first and second metal lines are spaced apart;
   a first via connecting the first source/drain contact to the first metal line;
   a second via connecting the first source/drain contact to the second metal line, wherein the second via lies within the extended portion of the first source/drain contact;
   a third via connecting the third source/drain contact to the first metal line; and
   a fourth via connecting the third source/drain contact to the second metal line, wherein the fourth via lies within the extended portion of the third source/drain contact.

2. The die of claim 1, wherein each of the first and third vias overlaps the one or more fins.

3. The die of claim 1, wherein the one or more fins comprise multiple fins.

4. The die of claim 3, wherein the multiple fins are merged under the first, second and third source/drain contacts.

5. The die of claim 1, wherein the second source/drain contact has an extended portion that does not overlap the one or more fins, and the die further comprises:
   third and fourth metal lines formed from the first metal layer, wherein the third and fourth metal lines are spaced apart;
   a fifth via connecting the second source/drain contact to the third metal line, wherein the fifth via lies within the extended portion of the second source/drain contact; and
   a sixth via connecting the second source/drain contact to the fourth metal line.

6. The die of claim 5, wherein the extended portion of the first source/drain contact and the extended portion of the second source/drain contact are located on opposite sides of the one or more fins.

7. The die of claim 5, wherein the first, second, third and fourth metal lines run parallel with one another.

* * * * *